United States Patent
Smirnov et al.

(10) Patent No.: US 11,037,595 B2
(45) Date of Patent: Jun. 15, 2021

(54) OPTICAL MEMORY DEVICES USING A SILICON WIRE GRID POLARIZER AND METHODS OF MAKING AND USING

(71) Applicant: Wostec, Inc., San Francisco, CA (US)

(72) Inventors: Valery Konstantinovich Smirnov, Yaroslavl (RU); Dmitry Stanislavovich Kibalov, Yaroslavl (RU)

(73) Assignee: Wostec, Inc., San Francisco, CA (US)

( * ) Notice: Subject to any disclaimer, the term of this patent is extended or adjusted under 35 U.S.C. 154(b) by 0 days.

(21) Appl. No.: 16/889,460

(22) Filed: Jun. 1, 2020

(65) Prior Publication Data

US 2020/0294542 A1    Sep. 17, 2020

Related U.S. Application Data

(62) Division of application No. 16/461,781, filed as application No. PCT/RU2016/000796 on Nov. 18, 2016.

(51) Int. Cl.
| | | |
|---|---|---|
| *G11B 7/135* | (2012.01) | |
| *G11B 7/0045* | (2006.01) | |
| *G02B 5/30* | (2006.01) | |
| *G11B 7/24035* | (2013.01) | |
| *G11B 7/243* | (2013.01) | |

(52) U.S. Cl.
CPC ........ *G11B 7/00454* (2013.01); *G02B 5/3058* (2013.01); *G11B 7/24035* (2013.01); *G11B 2007/24312* (2013.01)

(58) Field of Classification Search
None
See application file for complete search history.

(56) References Cited

U.S. PATENT DOCUMENTS

| | | |
|---|---|---|
| 4,009,933 A | 3/1977 | Firester |
| 4,072,541 A | 2/1978 | Meulenberg et al. |
| 4,233,109 A | 11/1980 | Nishizawa |
| 4,400,409 A | 8/1983 | Izu et al. |

(Continued)

FOREIGN PATENT DOCUMENTS

| | | |
|---|---|---|
| CN | 101486442 | 7/2009 |
| JP | 2010085990 | 4/2010 |

(Continued)

OTHER PUBLICATIONS

International Search Report and Written Opinion for International Patent Application No. PCT/RU2011/000489 dated Mar. 1, 2012.

(Continued)

*Primary Examiner* — Peter Vincent Agustin
(74) *Attorney, Agent, or Firm* — Branch Partners PLLC; Bruce E. Black

(57) ABSTRACT

Long term optical memory includes a storage medium composed from an array of silicon nanoridges positioned onto the fused silica glass. The array has first and second polarization contrast corresponding to different phase of silicon. The first polarization contrast results from amorphous phase of silicon and the second polarization contrast results from crystalline phase of silicon. The first and second polarization states are spatially distributed over plurality of localized data areas of the storage medium.

8 Claims, 6 Drawing Sheets

(56) References Cited

U.S. PATENT DOCUMENTS

| | | | |
|---|---|---|---|
| 4,460,434 A | 7/1984 | Johnson et al. | |
| 4,556,524 A | 12/1985 | Cullis et al. | |
| 4,857,080 A | 8/1989 | Baker et al. | |
| 5,160,618 A | 11/1992 | Burggraaf et al. | |
| 5,412,500 A | 5/1995 | Fergason | |
| 5,473,138 A | 12/1995 | Singh et al. | |
| 5,498,278 A | 3/1996 | Edlund | |
| 5,530,272 A | 6/1996 | Kudo et al. | |
| 5,578,379 A | 11/1996 | Stutzmann et al. | |
| 5,652,020 A | 7/1997 | Coffins et al. | |
| 5,663,592 A | 9/1997 | Miyazawa et al. | |
| 5,702,503 A | 12/1997 | Tse Tang | |
| 5,734,092 A | 3/1998 | Wang et al. | |
| 5,747,180 A | 5/1998 | Miller et al. | |
| 5,753,014 A | 5/1998 | Van Rijn | |
| 6,258,617 B1 | 7/2001 | Nitta et al. | |
| 6,274,007 B1 | 8/2001 | Smirnov et al. | |
| 6,417,939 B1 | 7/2002 | Laude | |
| 6,452,724 B1 | 9/2002 | Hansen et al. | |
| 6,518,194 B2 | 2/2003 | Winningham et al. | |
| 6,580,172 B2 | 6/2003 | Mancini et al. | |
| 6,667,240 B2 | 12/2003 | Ozaki et al. | |
| 6,706,576 B1 | 3/2004 | Ngo et al. | |
| 6,810,899 B2 | 11/2004 | Franz et al. | |
| 6,954,275 B2 | 10/2005 | Choi et al. | |
| 7,001,446 B2 | 2/2006 | Roark et al. | |
| 7,175,694 B2 | 2/2007 | Ma et al. | |
| 7,265,374 B2 | 9/2007 | Lee et al. | |
| 7,338,275 B2 | 3/2008 | Choi et al. | |
| 7,384,792 B1 | 6/2008 | Wang et al. | |
| 7,453,565 B2 | 11/2008 | Wang et al. | |
| 7,604,690 B2 | 10/2009 | Smirnov et al. | |
| 7,768,018 B2 | 8/2010 | Smirnov et al. | |
| 7,772,079 B2 | 8/2010 | Meng et al. | |
| 7,791,190 B2 | 9/2010 | Flores et al. | |
| 7,977,252 B2 | 7/2011 | Smirnov et al. | |
| 8,033,706 B1 | 10/2011 | Kelly et al. | |
| 8,426,320 B2 | 4/2013 | Smirnov et al. | |
| 8,859,440 B2 | 10/2014 | Smirnov et al. | |
| 8,859,888 B2 | 10/2014 | Smirnov et al. | |
| 10,672,427 B2* | 6/2020 | Smirnov | G11B 7/00454 |
| 2001/0005332 A1* | 6/2001 | Koishikawa | H01L 27/105 365/200 |
| 2002/0074307 A1 | 6/2002 | Cotteverte et al. | |
| 2002/0142704 A1 | 10/2002 | Hu et al. | |
| 2002/0154403 A1 | 10/2002 | Trotter | |
| 2002/0170497 A1 | 11/2002 | Smirnov et al. | |
| 2003/0095441 A1* | 5/2003 | Miida | H01L 29/7887 365/185.33 |
| 2003/0111106 A1 | 6/2003 | Nagano et al. | |
| 2003/0152787 A1 | 8/2003 | Arakawa et al. | |
| 2003/0171076 A1 | 9/2003 | Moloney et al. | |
| 2003/0183270 A1 | 10/2003 | Falk et al. | |
| 2003/0218744 A1 | 11/2003 | Shalaev et al. | |
| 2004/0070829 A1 | 4/2004 | Kurtz et al. | |
| 2004/0129135 A1 | 7/2004 | Roark et al. | |
| 2004/0174596 A1 | 9/2004 | Umeki | |
| 2004/0190116 A1 | 9/2004 | Lezec et al. | |
| 2004/0201890 A1 | 10/2004 | Crosby | |
| 2004/0238851 A1 | 12/2004 | Flores et al. | |
| 2005/0046943 A1 | 3/2005 | Suganuma | |
| 2005/0130072 A1 | 6/2005 | Koeda | |
| 2006/0043400 A1 | 3/2006 | Erchak et al. | |
| 2006/0159958 A1 | 7/2006 | Lee | |
| 2006/0205875 A1 | 9/2006 | Cha et al. | |
| 2006/0210886 A1 | 9/2006 | Mizuyama et al. | |
| 2006/0230937 A1 | 10/2006 | Smirnov et al. | |
| 2006/0273067 A1 | 12/2006 | Smirnov et al. | |
| 2006/0279843 A1* | 12/2006 | Kurt | G02B 5/1847 359/558 |
| 2007/0012355 A1 | 1/2007 | LoCascio et al. | |
| 2007/0082457 A1 | 4/2007 | Chou et al. | |
| 2007/0217008 A1 | 9/2007 | Wang et al. | |
| 2008/0072958 A1 | 3/2008 | Dutta | |
| 2008/0119034 A1 | 5/2008 | Smirnov et al. | |
| 2008/0128727 A1 | 6/2008 | Erchak et al. | |
| 2008/0135864 A1 | 6/2008 | David et al. | |
| 2008/0157161 A1* | 7/2008 | Tang | H01L 27/11521 257/315 |
| 2008/0169479 A1 | 7/2008 | Xu et al. | |
| 2009/0118605 A1 | 5/2009 | Van Duyne et al. | |
| 2009/0162966 A1 | 6/2009 | Jawarani et al. | |
| 2009/0214885 A1 | 8/2009 | Her et al. | |
| 2010/0110551 A1 | 5/2010 | Lamansky et al. | |
| 2010/0171949 A1 | 7/2010 | Mazur et al. | |
| 2010/0195204 A1 | 8/2010 | Walker | |
| 2010/0276612 A1 | 11/2010 | Norwood et al. | |
| 2010/0300893 A1 | 12/2010 | Suh et al. | |
| 2011/0197959 A1 | 8/2011 | Catchpole et al. | |
| 2011/0232744 A1 | 9/2011 | Larsen et al. | |
| 2012/0176766 A1 | 7/2012 | Natsumeda | |
| 2012/0195335 A1 | 8/2012 | Kalosha et al. | |
| 2012/0314189 A1 | 12/2012 | Natsumeda et al. | |
| 2013/0008497 A1 | 1/2013 | Smirnov et al. | |
| 2013/0057938 A1 | 3/2013 | Natsumeda et al. | |
| 2013/0228780 A1 | 9/2013 | Smirnov et al. | |
| 2014/0030531 A1 | 1/2014 | Mori | |
| 2014/0151715 A1 | 6/2014 | Smirnov et al. | |
| 2014/0352779 A1 | 12/2014 | Smirnov et al. | |
| 2015/0042988 A1 | 2/2015 | Smirnov et al. | |
| 2016/0018579 A1 | 1/2016 | Smirnov et al. | |
| 2016/0336036 A1 | 11/2016 | Bhaskaran et al. | |
| 2016/0351256 A1* | 12/2016 | Xia | G11C 13/0023 |
| 2017/0068104 A1 | 3/2017 | Ouderkirk et al. | |
| 2019/0362755 A1* | 11/2019 | Smirnov | G11B 7/00454 |
| 2020/0294542 A1* | 9/2020 | Smirnov | G11B 7/00454 |

FOREIGN PATENT DOCUMENTS

| | | |
|---|---|---|
| RU | 2141699 C1 | 11/1999 |
| RU | 2152108 C1 | 6/2000 |
| RU | 2173003 C2 | 8/2001 |
| RU | 2180885 C1 | 3/2002 |
| RU | 2204179 C1 | 5/2003 |
| RU | 2231171 C1 | 6/2004 |
| RU | 2240280 C1 | 11/2004 |
| RU | 2321101 C1 | 3/2008 |
| TW | 200939471 A | 9/2009 |
| WO | 2000017094 | 3/2000 |
| WO | 2003032398 | 4/2003 |
| WO | 2005050697 A2 | 6/2005 |
| WO | 2010072862 | 7/2010 |
| WO | 2011044687 | 4/2011 |
| WO | 2012009467 | 1/2012 |

OTHER PUBLICATIONS

International Search Report and Written Opinion for International Patent Application No. PCT/RU2011/000631 dated Mar. 1, 2012.

International Search Report and Written Opinion for International Patent Application No. PCT/RU2011/00594 dated Apr. 19, 2012.

International Search Report and Written Opinion for International Patent Application No. PCT/US2006/011420 dated Jun. 26, 2008.

International Search Report and Written Opinion for International Patent Application No. PCT/US2006/021564 dated Jul. 28, 2008.

Karen, A. et al., "Quantitative Investigation of the O2+-Induved Topography of GaAs and other III-V Semiconductors: an STM Study of the Ripple Formation and Suppression of the Secondary Ion Yield Change by Sample Rotation," Surface and Interface Analysis, vol. 23, 1995, pp. 506-513.

Scott, K.L. et al., "Pattern Generators and Microcolumns for Ion Beam Lithography," Journal of Vacuum Science Technology B, 18(6) 2000, pp. 3172-3176.

Vajo, J.J. et al., "Influence of O2+ Energy, Flux, and Fluence on the Formation and Growth of Sputtering-Induced Ripple Topography on Silicon," Journal of Vacuum Science and Tecnology A. 14(5), 1996, pp. 2709-2720.

Official Communication for U.S. Appl. No. 11/421,384 dated Aug. 21, 2008.

Official Communication for U.S. Appl. No. 11/421,384 dated Apr. 24, 2009.

(56) References Cited

OTHER PUBLICATIONS

Official Communication for U.S. Appl. No. 11/421,384 dated Sep. 3, 2009.
Official Communication for U.S. Appl. No. 13/164,387 dated Sep. 6, 2012.
Official Communication for U.S. Appl. No. 13/407,615 dated Mar. 28, 2014.
European Search Report for European Application No. 06851545.1 dated Feb. 8, 2010.
Official Communication for U.S. Appl. No. 13/859,442 dated Oct. 18, 2013.
Official Communication for U.S. Appl. No. 13/859,442 dated May 2, 2014.
Official Communication for U.S. Appl. No. 13/859,442 dated Mar. 27, 2014.
Official Communication for U.S. Appl. No. 11/100,175 dated Oct. 24, 2007.
Official Communication for U.S. Appl. No. 11/100,175 dated May 16, 2008.
Official Communication for U.S. Appl. No. 11/100,175 dated Feb. 9, 2009.
Chapter 7 in the book Sputtering by Particle Bombardment II: Sputtering of Alloys and Compounds, Electron and Neuron Sputtering, Surface Topography, Edited by R. Behrisch, 1983, Springer-Verlag, Berlin—Heidelberg—New York—Tokyo.
Mishra et al. Effect of initial target surface roughness on the evolution of ripple topography induced by oxygen sputtering of AI films, Journal of Applied Physics, vol. 105, 2009, 7 pages.
International Search Report and Written Opinion for PCT/RU2011/000977 dated Sep. 6, 2012.
International Search Report and Written Opinion for PCT/RU2014/000458 dated Feb. 5, 2015.
International Search Report and Written Opinion for PCT/RU2012/000016 dated Sep. 13, 2012.
International Search Report and Written Opinion for PCT/RU2012/000210 dated Dec. 20, 2012.
International Search Report and Written Opinion for PCT/RU2013/000192 dated Dec. 5, 2013.
Supplementary European Search Report for EP Application No. 11870692.8 dated Feb. 11, 2015.
Keller et al., "Optical and structural properties of GaN nanopillar and nanostripe arrays with embedded InGaN/GaN multiquantum wells", Journal of Applied Physics, 100 (2006): pp. 054314-1 to 054314-7.
Official Communication for U.S. Appl. No. 14/172,505 dated Mar. 30, 2015.
Official Communication for U.S. Appl. No. 14/172,505 dated Jun. 30, 2015.
Official Communication for U.S. Appl. No. 14/775,658 dated Feb. 19, 2016.
International Search Report and Written Opinion for PCT Application No. PCT/RU2016/000796 dated Sep. 7, 2017.
International Search Report and Written Opinion for PCT Application No. PCT/RU2017/000338 dated Nov. 16, 2017.
International Search Report and Written Opinion for PCT Application No. PCT/RU2017/000095 dated Nov. 16, 2017.
International Search Report and Written Opinion for PCT Application No. PCT/RU2017/000714 dated Aug. 2, 2018.
Official Communication for U.S. Appl. No. 15/320,241 dated Jan. 22, 2019.
Official Communication for U.S. Appl. No. 15/320,241 dated Jul. 30, 2019.

* cited by examiner

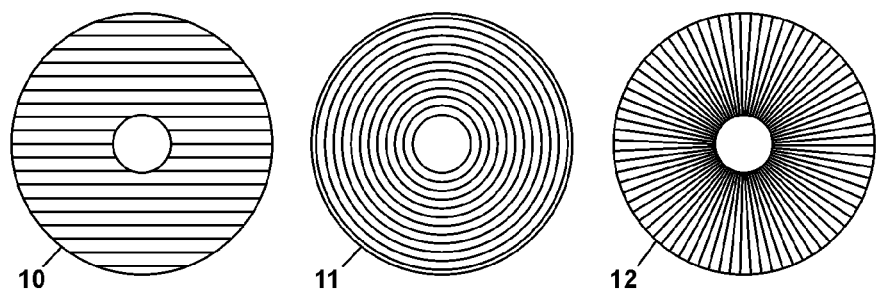
Fig. 9
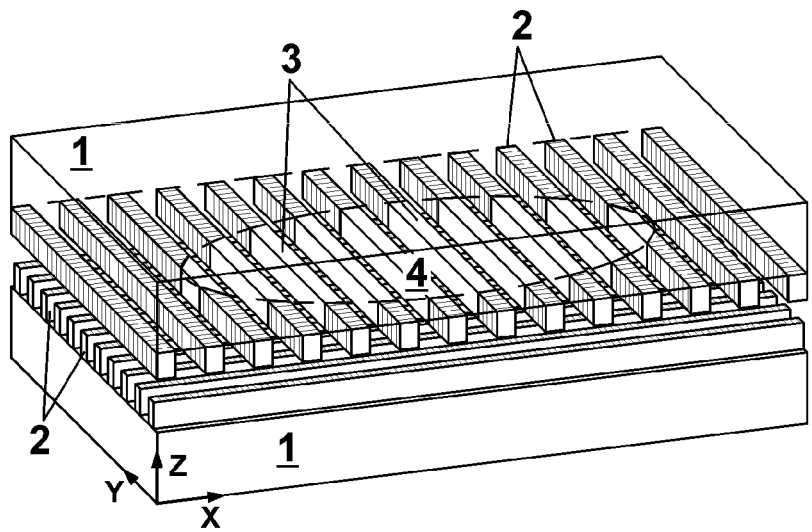
Fig. 10
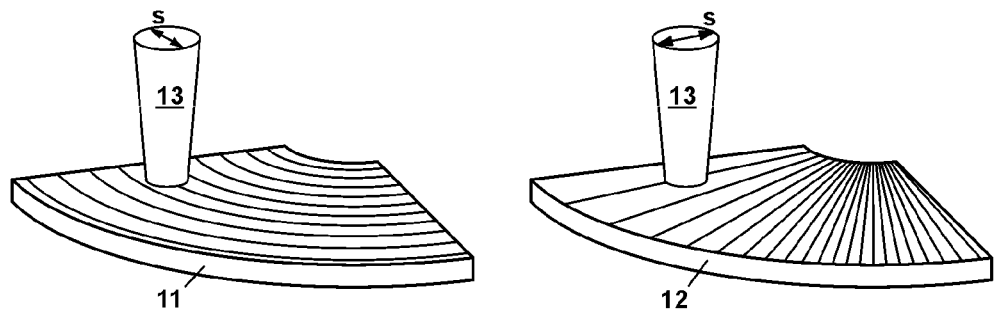
Fig. 11          Fig. 12

OPTICAL MEMORY DEVICES USING A SILICON WIRE GRID POLARIZER AND METHODS OF MAKING AND USING

CROSS-REFERENCE TO RELATED APPLICATIONS

This present application is a divisional of U.S. patent application Ser. No. 16/461,781, filed May 16, 2019, which is the U.S. national stage application of PCT Application No. PCT/RU2016/000796, filed Nov. 18, 2016, both of which are hereby incorporated by reference in their entirety.

FIELD

The invention relates to data storage devices including optical discs which may store the data for very long time. The invention also relates to wire grid polarizers that have a grid of conductors located on the surface of a substrate. The invention also relates to methods and devices for forming periodic wire grids with a period of, for example, 90 nm or less.

BACKGROUND

In conventional long term optical memory, data is recorded in localized data areas of fused silica glass modified by femtosecond laser pulses. At least some optical memory uses disc having multiple layers of microscopic data areas (dots) with differing refractive indices. In some instances, the microscopic data areas contain nanogratings, which include lamina structures embedded within the fused silica material. The nanogratings allow denser data writing due to each nanograting being characterized by individual orientation and retardance, which are controlled by polarization and intensity of writing laser beam. However, the size of data areas in one example is 3.7 µm, which limits the data density. For example, current compact discs have sub-micrometer data areas. Many known memory discs of fused silica glass with imbedded structures are produced by an expensive femtosecond laser technique, have low data density, and require complicated microscope systems to compensate for spherical aberrations and to extract data from multi-layer arrays of dots.

Optical memory discs are known that use a sapphire substrate and crystalline silicon film with localized data areas of silicon in amorphous phase formed by laser pulses. The principle of data storage for these discs is based on the difference in light transmission and reflectance for amorphous and crystalline silicon phases. The phase change of silicon is restorable using one laser pulse to transform crystalline phase of silicon into an amorphous phase in the data area, whereas the other laser pulse with different power and pulse duration may provide back transformation of the amorphous phase of silicon into the crystalline phase in the same data area, thus resulting in writing and erasing the data. However, the difference in light transmission and reflectance between amorphous and crystalline phases in silicon layers does not exceed about 10 times and the size of localized data areas is rather large at about 10 µm, which may limit the performance of the optical memory based on local phase change of silicon film.

BRIEF SUMMARY

One embodiment of the present invention is an optical memory which includes an optically transparent substrate and a storage medium disposed on the substrate and including a substantially planar array of silicon nanoridges, where the silicon nanoridges are configured and arranged for transformation between a first state and a second state. The first and second states have different responses to polarized light of at one or more wavelengths. The storage medium is configured and arranged to be spatially divided into a plurality of data areas.

Another embodiment is an optical memory device including the optical memory described above, a light source to produce a beam of polarized light directed onto the optical memory; and a detector to receive and detect polarized light from the data areas of the optical memory in response to the beam of polarized light being directed onto the optical memory.

In at least some embodiments, the first state corresponds to an amorphous phase of silicon and the second state corresponds to a crystalline phase of silicon. In at least some embodiments, the different responses to polarized light includes a polarization contrast ratio of the array in the first state being measurably different from a polarization contrast ratio of the array in the second state. In at least some embodiments, the optically transparent substrate is fused silica glass.

In at least some embodiments, the array of silicon nanoridges includes a quasi-periodic, anisotropic array of elongated ridge elements having a wave-ordered structure. In at least some embodiments, a period of the array of elongated ridge elements is in a range from 40 to 90 nm. In at least some embodiments, a height of silicon nanoridges is in a range 130 to 200 nm. In at least some embodiments, the silicon nanoridges are oriented along one rectilinear direction. In at least some embodiments, the nanoridges are oriented along a plurality of concentric circles. In at least some embodiments, the nanoridges are oriented along a plurality of radial rays.

In at least some embodiments, the light source is configured and arranged to produce the beam of polarized light having a wavelength in a range of 395-450 nm.

Yet another embodiment is a method of forming a hard nanomask on a rotating substrate, the method including depositing a first material to form a surface layer on top of a substrate; providing a flux of ions in a form of a sector centered to a rotation center of the substrate; rotating the substrate under the flux of ions; and irradiating a surface of the surface layer with the flux of ions during the substrate rotation until a hard nanomask is formed. The nanomask includes a substantially periodic array of elongated elements having a wavelike cross-section, at least some of the elongated elements having the following structure in cross-section: an inner region of the first material, a first outer region of a second material covering a first portion of the inner region, and a second outer region of the second material covering a second portion of the inner region and connecting with the first outer region at a wave crest, where the first outer region is substantially thicker than the second outer region, and where the second material is formed by modifying the first material by the ion flow.

A further embodiment is a method of forming a hard nanomask with the elements oriented along the concentric circles centered to the substrate rotation center. Such a nanomask is formed by the flux of ions having projection to the substrate surface along the central radial axis of the sector.

Another embodiment is a method of forming a hard nanomask with the elements oriented along the radial rays having common onset at the substrate rotation center. Such a nanomask is formed by the flux of ions having projection to the substrate surface perpendicular to the central radial axis of the sector.

In at least some embodiments, a period of the substantially periodic array is in a range from 40 to 90 nm. In at least some embodiments, the first material is silicon or amorphous silicon. In at least some embodiments, the flux of ions comprises a flux of $N_2^+$, $N^+$, $NO^+$, $NH_m^+$, or a mixture of a) $Ar^+$ and $N_2^+$, b) $Kr^+$ and $N_2^+$, or c) $Xe^+$ and $N_2^+$ ions. In at least some embodiments, a thickness of the first outer region is at least 4 nm. In at least some embodiments, a thickness of the second outer region is no more than 2 nm.

BRIEF DESCRIPTION OF THE DRAWINGS

FIG. 9 schematically illustrates optical memory discs with arrays of silicon nanoridges, in which nanoridges have different possible orientations: along one rectilinear direction, along concentric circles, and along radial rays, according to the invention;

FIG. 10 is a perspective view of a small fragment of an optical memory disc containing two crossed amorphous silicon wire grid polarizers, one of which has a data area, where the silicon nanowires have a crystalline phase, according to the invention;

FIG. 11 is a partial perspective view of the mutual orientation of an optical memory disc with a storage medium composed from an array of silicon nanoridges oriented along concentric circles and a beam of polarized light focused onto the storage medium, according to the invention;

FIG. 12 is a partial perspective view of the mutual orientation of an optical memory disc with a storage medium composed from an array of silicon nanoridges oriented along radial rays and a beam of polarized light focused onto the storage medium, according to the invention;

DETAILED DESCRIPTION

Detailed descriptions of the preferred embodiments are provided herein. It is to be understood, however, that the present inventions may be embodied in various forms. Therefore, specific implementations disclosed herein are not to be interpreted as limiting.

As described herein, a long term optical memory is based on a silicon WGP with microscopic data areas, in which the silicon phase is changed from crystalline to amorphous or vice versa, uses low cost lasers for data writing, has sufficient data density in single surface layer, or allows microscope-free data readout or any combination of these features.

Figure 1:
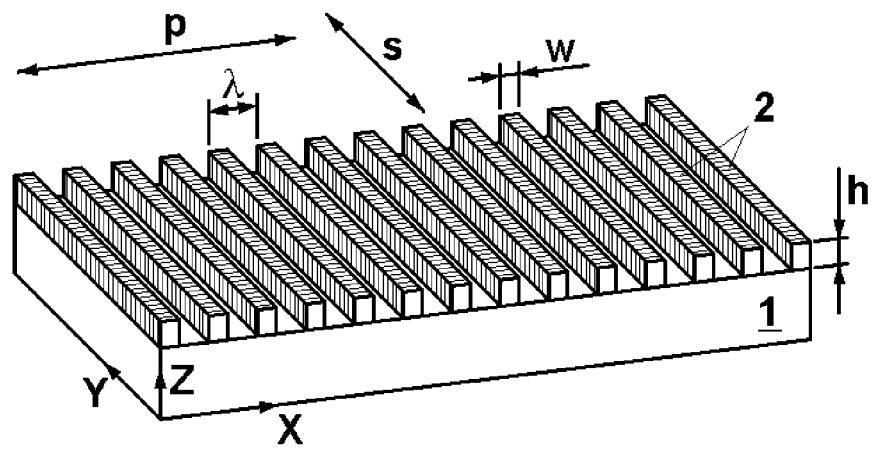
FIG. 1 is a perspective view of a wire grid polarizer containing nanowires of amorphous silicon.

Arrays of amorphous silicon (a-Si) nanowires are used as wire grid polarizers (WGP) for violet and ultra violet (UV) applications. An example of an a-Si WGP is shown in FIG. 1. On the plane surface of a transparent substrate 1 silicon nanowires 2 are disposed and oriented along one direction, i.e. Y axis. For good WGP performance the nanowire period λ should be considerably smaller than the wavelength of light. The nanowire height (h) and width (w) affect the WGP performance. Linear polarized light with P polarization, which is along X axis and perpendicular to the nanowires, mostly transmits through the WGP and can be characterized by transmittance $T_P$. Light with S polarization, which is along X axis and parallel to the nanowires, is mostly reflected by WGP and only small amount of S polarized light as characterized by transmittance $T_S$ penetrates through WGP. The ratio of $T_P$ to $T_S$ is known as the polarizer contrast ratio $CR=T_P/T_S$. Examples of the CR values of known WGP based on silicon nanowires are CR=90 for a nanowire period of 140 nm and a light wavelength of 365 nm and CR=324 for a nanowire period of 120 nm and a light wavelength of 394 nm.

A method for nanorelief formation on a film surface, utilizing plasma modification of wave ordered structure (WOS) formed on amorphous silicon layer, is disclosed in Russian Patent Application RU 2204179, incorporated herein by reference. Using a WOS nanomask, various WGP may be fabricated as disclosed in U.S. Pat. No. 7,768,018 and in PCT Patent Application Publication No. 2014/142700, both of which are incorporated herein by reference. WOS-based WGP may include silicon nanowires or nanoridges disposed on the surface of optically transparent substrate as shown in structure 1023 of FIG. 8 in the description of U.S. Pat. No. 7,768,018.

Figure 2:
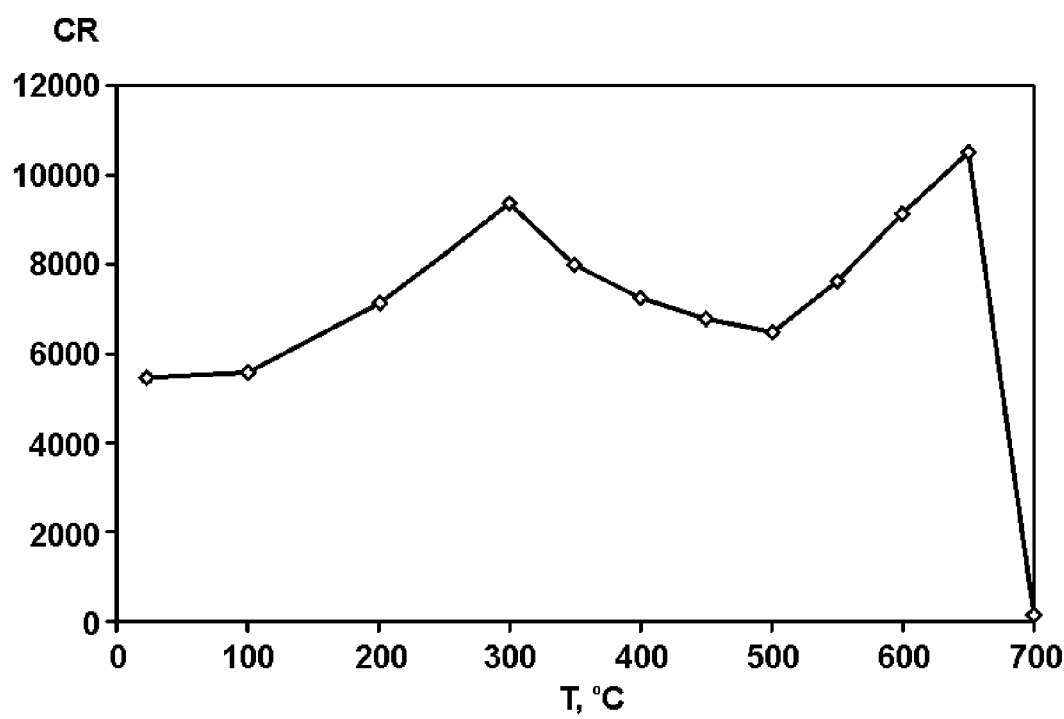
FIG. 2 is a graph of a dependence of the contrast ratio (CR) of an amorphous silicon nanowire polarizer, which was made using a WOS nanomask, on successive stepwise annealing at different temperatures (from room temperature to 700° C.), where each annealing temperature step was held for an hour then the polarizer was cooled to room temperature and CR value was measured at the wavelength of light 405 nm, according to the invention.
Figure 3:
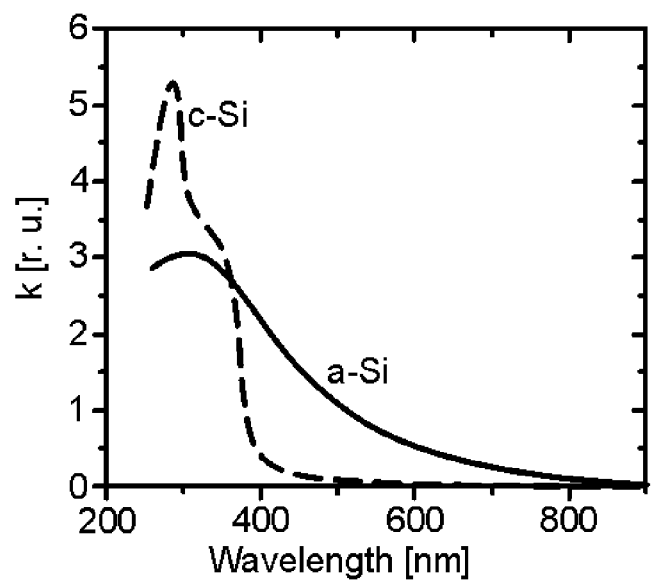
FIG. 3 is a graph of the extinction coefficient (k) versus wavelength of light for amorphous silicon (a-Si) and crystalline silicon (c-Si) materials.

An array of silicon nanowires or nanoridges can be used as a durable storage medium. The array is positioned onto a substrate, such as a fused silica glass substrate. It has been found that the CR of a silicon WGP measured at the light wavelength of 405 nm is considerably affected by annealing of the WGP. FIG. 2 is a graph of the dependence of CR of an amorphous silicon WGP, which was made using WOS nanomask, on successive stepwise annealing. Each annealing temperature step was held for an hour then the WGP was cooled down to room temperature and the CR value was measured at an optical test bench equipped with a 405-nm semiconductor laser. High CR values in the range 500-15,000 were measured for WOS-based a-Si WGP samples with a nanoridge period λ=70 nm and different nanoridge heights, h, in the corresponding range h=130-200 nm. After annealing at 700° C. the CR value of a WOS based a-Si WGP abruptly drops from CR>10,000 down to CR≈10. It is thought that this considerable change in CR may be explained by the annealing at 700° C. resulting in a phase transformation of amorphous silicon (a-Si) into crystalline silicon (c-Si) material in the silicon nanowires of WGP. Known spectral dependences of extinction coefficient (k) for a-Si and c-Si materials are shown in FIG. 3. The extinction coefficient k characterizes the absorption of light by these materials. A prominent difference between k values for a-Si and c-Si at the wavelength of 405 nm may result in significant enhancement of transmittance $T_S$ for silicon WGP thus resulting in corresponding significant lowering of CR values. In at least some embodiments, light having a wavelength in a range from 395 to 450 nm, or 400 to 410 nm, can be used for reading or writing an optical memory formed using a WOS-based a-Si WGP.

An estimation of the storage time at room temperature for a storage medium based on an a-Si WGP is about 56 million years. The estimation is made on the basis of the activation energy value for the crystallization process for silicon nanowires being equal to 1 eV and because silicon WGP withstands annealing at 650° C. for at least 2 hours without change in CR value. Thus, the storage medium can be considered as durable and suitable for long term memory storage.

Figure 4:
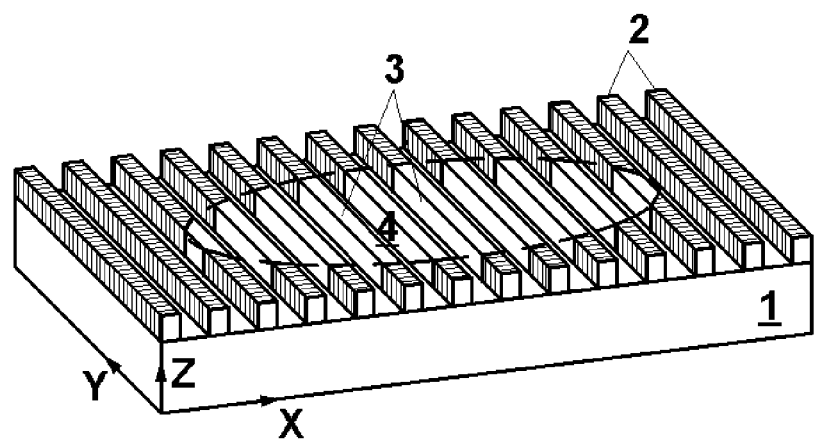
FIG. 4 is a perspective view of a small part of storage medium based on the array of silicon nanowires to form a localized data area, according to the invention.

FIG. 4 shows a part of a storage medium composed from an array of silicon nanowires. Nanowires 2 are made of a-Si material whereas nanowires 3 contain c-Si material within a circular localized data area 4. Although the data area 4 is illustrated as circular, in other embodiments, other regular or irregular data areas can be used including, but not limited to, square, rectangular, trapezoidal, triangular, pentagonal, hexagonal, octagonal, decagonal, or dodecagonal areas may be used. Outside the data area 4 the nanowires are in an amorphous state. In at least some embodiments, the data area 4 may have a diameter in a range from 0.1 to 5 micrometers; however, larger or smaller data areas may also be used.

The data area 4 may be formed by a laser pulse, for example, at wavelength of about 405 nm with a radiation power in the 10-100 mW range focused on the area of 0.5-2 μm in diameter and pulse duration in the range $10^{-2}$-$10^{-6}$ s. Other continuous wave (CW) or pulsed lasers known in the art may be used to locally change the phase of silicon in a-Si nanowires. This phase change can be implemented partially, i.e. only a part of a-Si nanowire volume is transformed into crystalline phase by laser irradiation within data area 4, thus reducing the power of the laser beam used. This exemplifies a writing of data on the optical memory. Data can be erased by changing the crystalline phase of silicon to the amorphous phase by laser irradiation. Such an arrangement is described in, for example, U.S. Pat. No. 4,556,524, incorporated herein by reference.

Amorphous silicon (a-Si) WGP can be formed using a WOS nanomask in an a-Si layer deposited on an optically transparent substrate as disclosed in U.S. Pat. No. 7,768,018 and in PCT Patent Application Publication No. 2014/142700, both of which are incorporated herein by reference.

Figure 5:
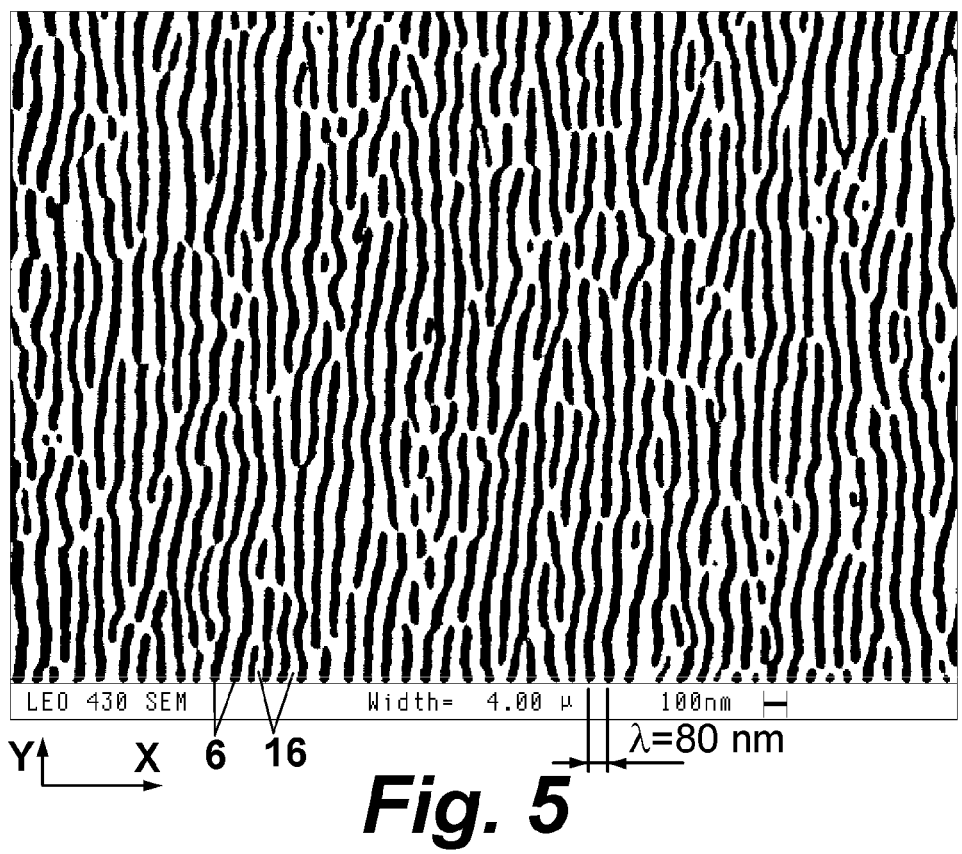
FIG. 5 is a SEM top view of a hard WOS nanomask formed by the ion flux on the surface of amorphous silicon layer disposed on a fused silica glass substrate.

A WOS nanomask, with or without ordering, may be used. FIG. 5 shows a SEM top view of a hard WOS nanomask formed by the ion flux on the surface of amorphous silicon layer deposited onto a fused silica glass substrate. Waves (elongated elements) of a WOS nanomask are mostly elongated in the Y-axis direction. Each wave on one slope has a thick silicon nitride region 6 viewed as black in FIG. 5 and on the opposite slope has a region 16 of thin silicon nitride viewed as white in FIG. 5. Elongated elements of the nanomask are arranged into a wave-ordered structure pattern as viewed from the top. In this example, the average period of the WOS, λ, is approximately equal to 80 nm.

Figure 6:
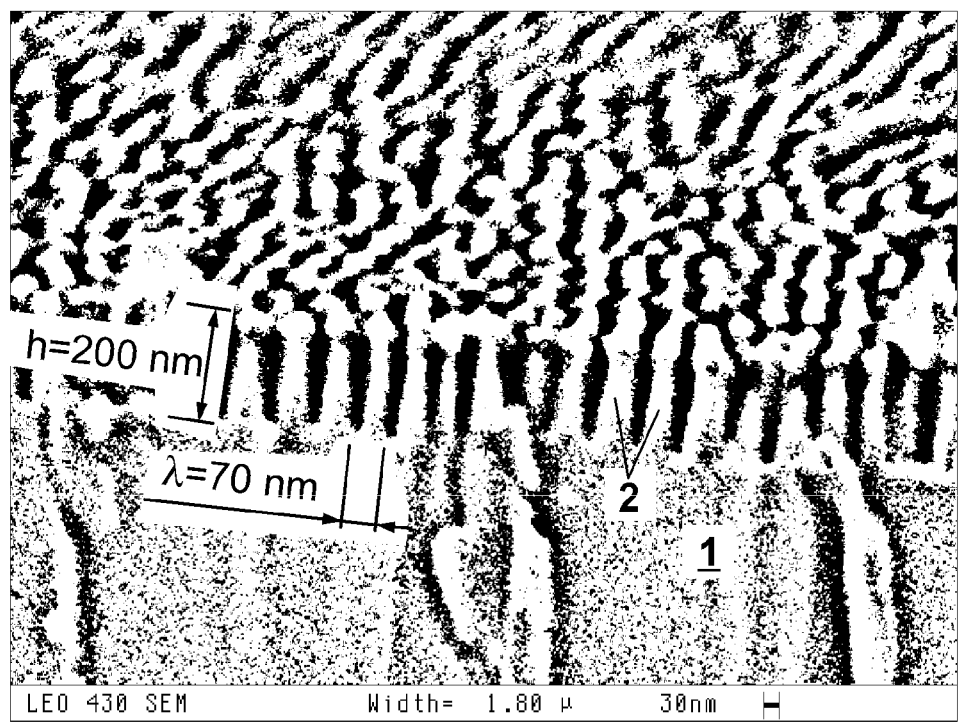
FIG. 6 is a SEM cross-sectional view, angled at 82°, of an amorphous silicon nanowire polarizer based on a WOS nanomask and composed of a planar array of amorphous silicon nanoridges positioned onto a fused silica glass substrate, according to the invention.

FIG. 6 shows a SEM cross-sectional view, angled at 82°, of a WOS based a-Si WGP that is composed of a planar array of a-Si nanoridges 2 positioned onto a fused silica glass substrate 1. An ultrathin gold layer of about 10 nm was deposited onto the WGP sample for SEM observation. In this example, the average period of the array, λ, is approximately equal to 70 nm and the height of the nanoridges, h, is approximately equal to 200 nm. This WGP has CR≈15,000 and $T_T$≈26%. In at least some embodiments, the period of the array is in a range from 40 to 90 nm.

Figure 7:
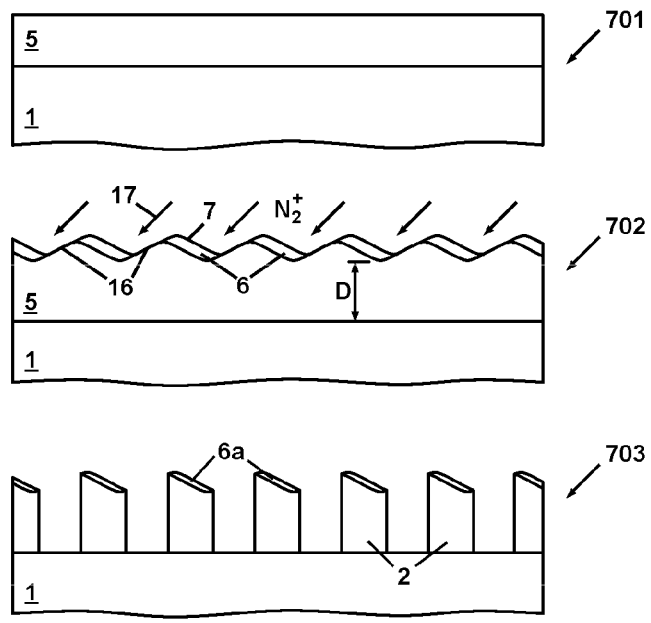
FIG. 7 schematically illustrates steps in one embodiment of a method for formation of an amorphous silicon nanowire polarizer, such as a wire grid polarizer, using a hard WOS nanomask formed in amorphous silicon layer, according to the invention.

FIG. 7 illustrates one embodiment of a method to manufacture a WOS-based a-Si WGP on a transparent glass substrate. It shows a structure 701, including a substrate (e.g., fused silica glass) 1 and an amorphous silicon (a-Si) layer 5 (for example, approximately 240-330 nm thick) disposed on the substrate.

The amorphous silicon (a-Si) layer 5 may be deposited, for example, by magnetron sputtering of a silicon target, by silicon target evaporation with an electron beam in high vacuum, or by any other method known in art. The thickness of the layer 5 is selected to enable the formation of a nanostructure with a desired period, (for example, a period of approximately λ≈60-80 nm).

A WOS 7 is formed on the surface of the a-Si layer 5 which results in the structure 702. In this example, the WOS serves as a nanomask (WOS nanomask) for etching of silicon. The WOS can be formed using an oblique flow 17 of nitrogen $N_2^+$ or other ions (for example, $N^+$, $NO^+$, $NH_m^+$, or a mixture of a) $Ar^+$ and $N_2^+$, b) $Kr^+$ and $N_2^+$, or c) $Xe^+$ and $N_2^+$ ions). Each WOS wave (elongated element) in cross-section has a wave-like shape and contains thick silicon nitride regions 6 and thin silicon nitride regions 16, which are connected at a wave crest. Regions 6 and 16 are both formed from silicon by the nitrogen ion beam. WOS elements are mostly elongated in one direction perpendicular to the drawing plane of FIG. 7. The top view of this WOS pattern is similar to that shown in FIG. 5. As shown in the structure 702, the thick silicon nitride regions 6 of the WOS are spaced from the surface of the transparent substrate 1 by a distance D, which may range from, for example, 110 to 180 nm.

Referring again to FIG. 7, after the WOS nanomask 7 is formed, the structure 702 is modified by applying a reactive-ion plasma ($Cl_2$, $Cl_2$—Ar, HBr—$O_2$ or $Cl_2$—He—$O_2$ or by any other etching method known in art) to the amorphous silicon layer 5, using the WOS nanomask 7. The plasma process results in silicon etching down to the surface of substrate 1, thus forming a WOS based a-Si WGP, which is shown as the structure 703. In at least some embodiments, the plasma process results in a modified WOS nanomask having silicon nitride regions 6a formed on top of nanoridges 2 of amorphous silicon, as shown in the structure 703 of FIG. 7. The thickness of the regions 6a may become thinner than the thickness of the original regions 6 during plasma etching.

Figure 8:
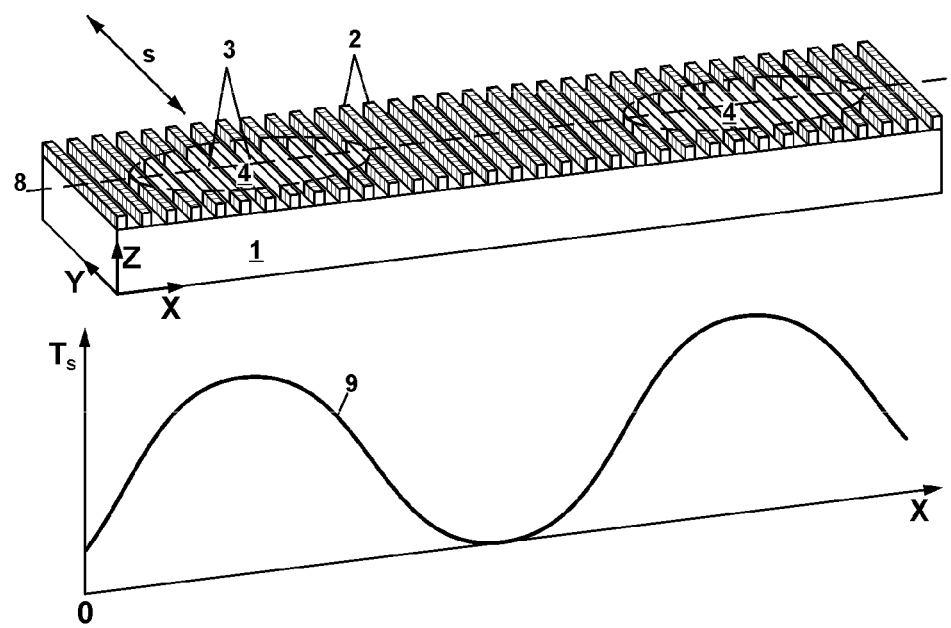
FIG. 8 is a perspective view of a small fragment of silicon nanowire storage medium near two data areas, where the silicon nanowires have a crystalline phase, and corresponding dependence of transmittance ($T_S$) of S-polarized light beam with diameter close to that of the data areas on the distance along the line across the data areas, according to the invention.

FIG. 8 shows a small part of an a-Si WGP having two circular data areas 4, where the silicon nanowires 3 have a crystalline phase. Outside data areas 4 the nanowires 2 are of amorphous silicon. In at least some embodiments, the intensity pattern 9 is generated by S-polarized light beam 5 focused onto the WGP plane to a diameter close to that of the data areas, the beam traveling along the line 8 across the data areas. A detector that measures the intensity pattern 9 may read the information from the WGP encoded in data areas as known in the art. In at least some embodiments, for a corresponding change in CR from 1,000-15,000 outside data areas down to about 10 within data areas the ratio of maximum to minimum in intensity patterns may exceed 100-1,500. The CR difference for WOS-based WGP is greater than the change in light transmittance between a-Si data areas and surrounding c-Si for known optical discs based on silicon films. In general, the greater the difference in intensity pattern the better is the performance of optical memory.

FIG. 9 schematically illustrates several embodiments of optical memory discs with arrays of silicon nanoridges having different arrangements. In at least some embodiments, the optical memory disc 10 may have rectilinear orientation of nanoridges in the array. In at least some embodiments, optical memory disc 11 may have nanoridges oriented along concentric circles. In at least some other embodiments, optical memory disk 12 may have nanoridges disposed along radial rays. In at least some embodiments, for readout of the disc 10, one may use a polarization rotation device to keep the polarization direction of the light beam parallel to the nanoridges during disk rotation. Such polarization rotating devices based on liquid crystal cells are known in the art (for example, system for continuously rotating plane of polarized light is disclosed in U.S. Pat. No. 5,412,500, incorporated herein by reference). Note that discs 11 and 12 may be read using the light beam having a fixed polarization direction. In at least some embodiments, for discs 11 and 12 a certain adjustment of the polarization direction of the reading light beam may be performed with the use of a polarization rotating device.

In at least some embodiments, the optical memory disc may be composed from two crossed a-Si WGP, one of which has circular localized data areas 4, where the silicon nanowires 3 have crystalline phase, as shown in FIG. 10. Outside data areas 4 the silicon nanowires 2 are amorphous. For such embodiments, unpolarized light may be used to readout the data areas.

FIG. 11 illustrates one embodiment, where the optical memory disc 11 with an array of silicon nanoridges oriented along concentric circles is irradiated by polarized light beam 13 focused onto the array plane for data readout, the beam S polarization being fixed along the circles during disc rotation or adjusted using polarization rotating device.

FIG. 12 illustrates another embodiment, where the optical memory disc 12 with array of silicon nanoridges oriented along radial rays is irradiated by polarized light beam 13 focused onto the array plane for data readout, the beam S polarization being fixed along the radial rays during disc rotation or adjusted using polarization rotating device.

Figure 13:
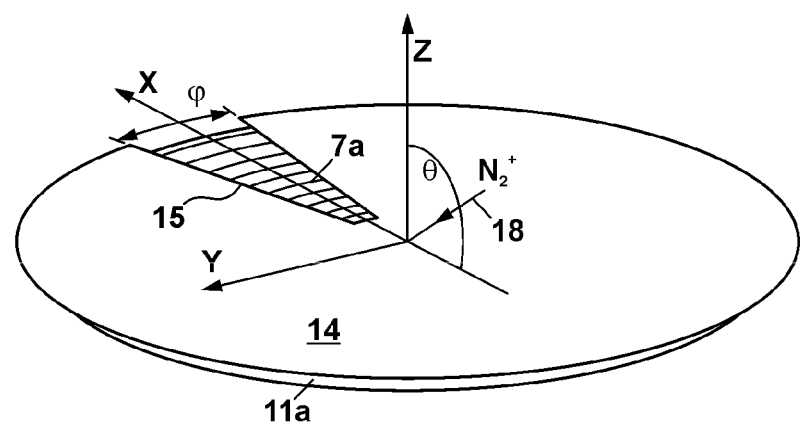
FIG. 13 is a diagram illustrating a mutual arrangement of ion flux and a sector diaphragm to form a circular WOS nanomask having elements oriented along concentric circles on a disc surface, according to the invention.

In at least some embodiments, a-Si nanoridges are oriented along concentric circles on a disc surface and fabricated using a circular WOS nanomask, which has wave-like elements mostly elongated along the concentric circles of the disc. In at least some embodiments, a circular WOS nanomask is fabricated by a flux of ions having the shape of a sector centered to the center of the circles. Such sector-shaped ion fluxes may be formed, for example, by sector diaphragms. FIG. 13 illustrates a mutual arrangement of $N_2^+$ ion flux 18 and a sector diaphragm 14 with opened sector 15 to form a circular WOS nanomask having elements 7a oriented along concentric circles on the surface of disc 11a. The disc surface is covered by an a-Si layer and irradiated by the ion flux only within the opened sector 15 of angle φ centered to X axis, i.e. central radial axis of the sector. The ion flux is directed along the vector 18 in the ion incidence plane XZ at angle θ to the disc surface normal (Z axis). During ion irradiation the disc is rotated around Z axis under the fixed diaphragm 14. In at least some embodiments, a circular WOS nanomask may be formed during a single revolution of the disc. In at least some embodiments, a circular WOS nanomask may be formed during a few revolutions of the disc. In at least some embodiments, the sector angle φ in diaphragm is of about 10° to 20°. In at least some embodiments, the ion fluence for the formation of circular WOS nanomask is the same as the fluence used for the formation of other WOS nanomasks.

Figure 14:
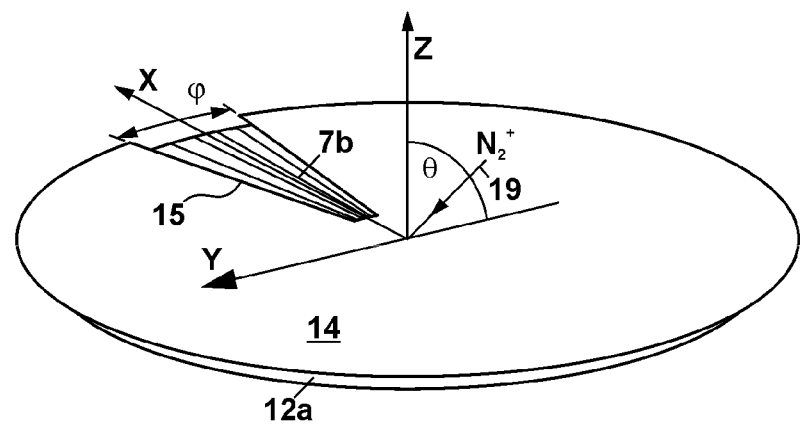
FIG. 14 is a diagram illustrating a mutual arrangement of ion flux and a sector diaphragm to form a radial WOS nanomask having elements oriented along radial rays on a disc surface, according to the invention.

In at least some embodiments, a-Si nanoridges are oriented along radial rays on a disc surface and fabricated using a radial WOS nanomask, which has wave like elements mostly elongated along the radial rays of the disc. FIG. 14 illustrates a mutual arrangement of $N_2^+$ ion flux 19 and a sector diaphragm 14 with opened sector 15 to form a radial WOS nanomask having elements 7b oriented along radial rays on the surface of disc 12a. The disc surface is covered by an a-Si layer and irradiated by the ion flux only within the opened sector 15 of angle φ centered to X axis, i.e. central radial axis of the sector. The ion flux is directed along the vector 19 in the ion incidence plane YZ at angle θ to the disc surface normal (Z axis). During ion irradiation, the disc is rotated around Z axis under the fixed diaphragm 14. In at least some embodiments, a radial WOS nanomask may be formed during single revolution of the disc. In at least some embodiments, a radial WOS nanomask may be formed during several revolutions of the disc. In at least some embodiments, the sector angle φ in diaphragm is of about 10° to 20°. In at least some embodiments, the ion fluence for the formation of radial WOS nanomask is the same as the fluence required for the formation of other WOS nanomasks.

What is claimed as new and desired to be protected by Letters Patent of the United States is:

1. A method of forming a hard nanomask on a rotating substrate, the method comprising:
    depositing a first material to form a surface layer on top of a substrate;
    providing a flux of ions in a form of a sector centered to a rotation center of the substrate;
    rotating the substrate under the flux of ions; and
    irradiating a surface of the surface layer with the flux of ions during the substrate rotation until a hard nanomask is formed, the hard nanomask comprising a substantially periodic array of elongated elements having a wavelike cross-section, at least some of the elongated elements having the following structure in cross-section: an inner region of the first material, a first outer region of a second material covering a first portion of the inner region, and a second outer region of the second material covering a second portion of the inner region and connecting with the first outer region at a wave crest, wherein the first outer region is substantially thicker than the second outer region, and wherein the second material is formed by modifying the first material by the flux of ions.

2. The method of claim 1, wherein the flux of ions has a projection to the surface of the surface layer along a central radial axis of the sector and the elongated elements of the hard nanomask are oriented along concentric circles centered about the rotation center.

3. The method of claim 2, wherein the flux of ions has a projection to the surface of the surface layer perpendicular to the central radial axis of the sector and elongated elements of the hard nanomask are oriented along radial rays extending radially relative to the rotation center.

4. The method of claim 1, wherein a period of the substantially periodic array is in a range from 40 to 90 nm.

5. The method of claim 1, wherein the first material is silicon or amorphous silicon.

6. The method of claim 1, wherein the flux of ions comprises a flux of $N_2^+$, $N^+$, $NO^+$, $NH_m^+$, or a mixture of a) $Ar^+$ and $N_2^+$, b) $Kr^+$ and $N_2^+$, or c) $Xe^+$ and $N_2^+$ ions.

7. The method of claim 1, wherein a thickness of the first outer region is at least 4 nm.

8. The method of claim 1, wherein a thickness of the second outer region is no more than 2 nm.

* * * * *